United States Patent [19]
Lenhard

[11] Patent Number: 5,565,765
[45] Date of Patent: Oct. 15, 1996

[54] CURRENT SENSOR OPERATING ACCORDING TO THE COMPENSATION THEOREM

[75] Inventor: Friedrich Lenhard, Hanau, Germany

[73] Assignee: Vacuumschmelze GmbH, Hanau, Germany

[21] Appl. No.: 494,771

[22] Filed: Jun. 26, 1995

[30]  Foreign Application Priority Data

Jul. 5, 1994 [DE] Germany ............... 44 23 429.5

[51] Int. Cl.$^6$ .................. G01R 1/20; G01R 17/06
[52] U.S. Cl. .................. 324/117 R; 324/99 R; 324/127
[58] Field of Search ............. 324/127, 117 H, 324/117 R, 99 R, 99 D

[56]  References Cited

U.S. PATENT DOCUMENTS

| | | | |
|---|---|---|---|
| 2,928,048 | 3/1960 | Postal | 324/117 H |
| 3,323,056 | 5/1967 | Haley | 324/127 |
| 3,323,057 | 5/1967 | Haley | 324/127 |
| 3,422,351 | 1/1969 | Pihl | 324/117 H |
| 3,525,041 | 8/1970 | Velsink | 324/117 H |
| 3,573,616 | 3/1971 | Kahen | 324/117 H |
| 3,885,212 | 5/1975 | Herbert | 324/117 H |
| 4,961,049 | 10/1990 | Ghislanzoni | 324/117 H |

FOREIGN PATENT DOCUMENTS 0356248  2/1990  European Pat. Off. .

OTHER PUBLICATIONS

"Alternating–Current Circuit Theory", 2nd Ed., Reed, pp. 345–347 (1956) (month unavailable).

Primary Examiner—Ernest F. Karlsen
Attorney, Agent, or Firm—Hill, Steadman & Simpson

[57]  ABSTRACT

A current sensor operating according to the compensation thereon which is particularly suited for acquiring high currents has a secondary winding of the current transformer is divided into at least two sub-windings that are supplied by different amplifiers in an amplifier arrangement. This results in symmetrical loading of the supply voltage so that twice as high a compensation current is enabled given the same internal resistance of the sub-windings and same resistance of the terminating resistor as in known current sensors of this type.

3 Claims, 4 Drawing Sheets

CURRENT SENSOR OPERATING ACCORDING TO THE COMPENSATION THEOREM

BACKGROUND OF THE INVENTION

1. Field of the Invention

The present invention is directed to a current sensor operating according to the compensation theorem, particularly for measuring direct and alternating currents.

2. Description of the Prior Art

In a current sensor which operating according to the compensation theorem, the magnetic field generated in a magnetic core by a primary winding through which the current to be measured flows is compensated by the compensation current in a secondary winding. At least one sensor influenced by the magnetic field measures deviations from zero flux for controlling the compensation current, and supplies this measured value via an evaluation circuit to an amplifier arrangement for generating the compensation current. The secondary winding, in series with a terminating resistor, is connected to the output of the amplifier arrangement, so that a voltage proportional to the current i1 to be measured is present across the terminating resistor.

A current sensor of this type operating according to the compensation theorem is disclosed, for example, in European Application 0 356 248. The schematic circuit of this known current sensor is shown in FIG. 1 herein. A current to be measured flows through the primary winding 1 of a current transformer that has a magnetic core 2 as well as a sensor 3 that measures the magnetic flux in the magnetic core 2.

In the arrangement disclosed in European Application 0 356 248, the sensor 3 is composed of a transformer driven into saturation and having a rectangular magnetization characteristic. In principle, any desired sensor for a magnetic field can be employed, for example, a Hall probe, an amorphous strip with a winding, etc. The output voltage of the sensor 3 is evaluated in a following evaluation circuit 4 whose output is connected to the input of an amplifier arrangement 5. The output of the amplifier arrangement 5 is connected to ground via the secondary winding 6 of the current transformer and via a terminating resistor 7.

The functioning of this arrangement is as follows: Via the primary winding 1, the current to be measured generates a flux in the magnetic core 2 that is acquired by the sensor 3. The evaluation circuit 4 that follows the sensor 3 supplies a signal that is dependent on the size and direction of the magnetic field in the magnetic core 2 to the amplifier arrangement 5. The amplifier arrangement 5 drives a compensation current through the secondary winding 6. The compensation current is directed such that its magnetic field compensates the magnetic flux in the magnetic core 2. The current in the secondary winding 6 is modified by the sensor 3 until the magnetic field in the magnetic core 2 becomes zero. The current in the secondary winding 6 is thus a criterion for the momentary value of the current to be measured in the primary winding 1, so that direct as well as alternating currents can be measured. This current also flows across a terminating resistor 7 across which the output voltage $U_a$ of the current sensor drops, this voltage drop corresponding in size and phase relation to the current to be measured in the primary winding 1.

Since this output voltage $U_a$—dependent on the direction of the current to be measured—must assume positive as well as negative values, a current will flow—dependent on the direction of the current—either from the positive pole ⊕ of the supply voltage of the amplifier arrangement via the secondary winding 6 and the terminating resistor 7 or—given an opposite direction of the current in the primary winding 1—a current will be supplied from the minus pole e of the amplifier arrangement 5.

Given this arrangement, the maximum output voltage $U_a$ is dependent on the size of the supply voltage of the amplifier arrangement 5 as well as on the value of resistance of the terminating resistor 7 and on the value of resistance of the ohmic internal resistance of the secondary winding 6. Particularly when relatively high currents are to be measured, the secondary winding 6 must have many turns, so that the internal resistance thereof necessarily increases. Because the supply voltage of the amplifier arrangement 5 cannot be arbitrarily raised, it is necessary for measuring very high currents as occur, for example, in circuits of electric cars, to either reduce the internal resistance of the secondary winding 6 by using a thicker wire, or the terminating resistor 7 must be made smaller. Using a thicker wire has the disadvantage that the current transformer composed of the primary winding I and the secondary winding 6 becomes relatively large. Using a smaller terminating resistor 7, however, has the disadvantage that the dissipated power that is required for generating the compensation current in the secondary winding 6 is increased.

SUMMARY OF THE INVENTION

An object of the present invention is to improve known current sensors operating according to the compensation theorem such that, given no change in the current to be measured, the structural volume of the current sensor can be reduced compared to a known sensor of this type or, given a design that is otherwise the same as in a known sensor of this type, a higher compensation current is enabled, so that at least double the maximum current can be acquired in the primary winding and can be correctly compensated given the same structural volume of the current transformer and given the same sensitivity.

This object is inventively achieved in a current sensor operating according to the compensation theorem of the type generally described above wherein the secondary winding is composed of at least two sub-windings whose winding ends are connected to the amplifier arrangement such that each sub-winding is followed by its own amplifier which supplies the compensation current for that sub-winding.

DESCRIPTION OF THE PREFERRED EMBODIMENTS

Figure 1:
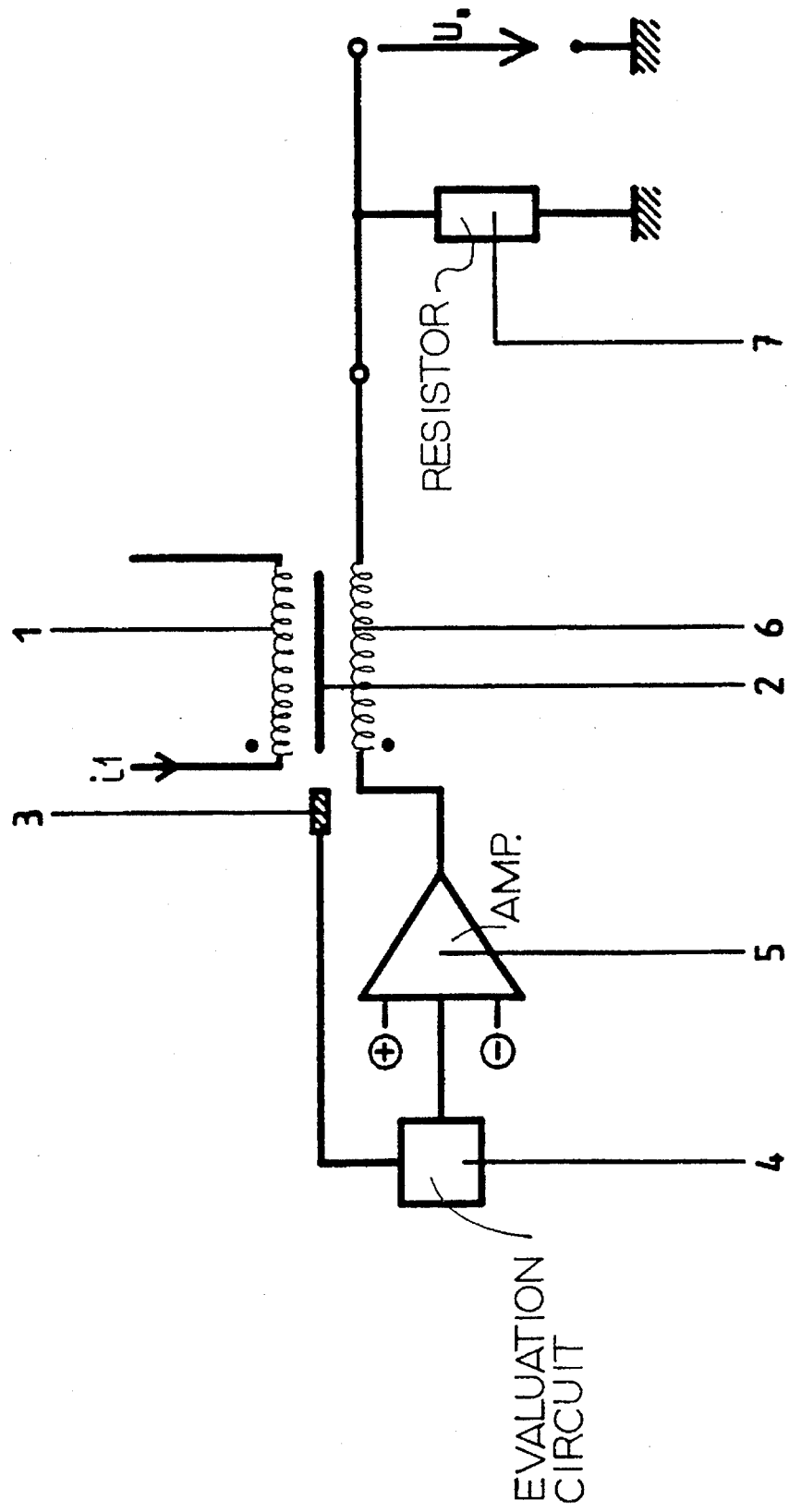
FIG. 1 is a schematic circuit diagram of a known current sensor.
Figure 2:
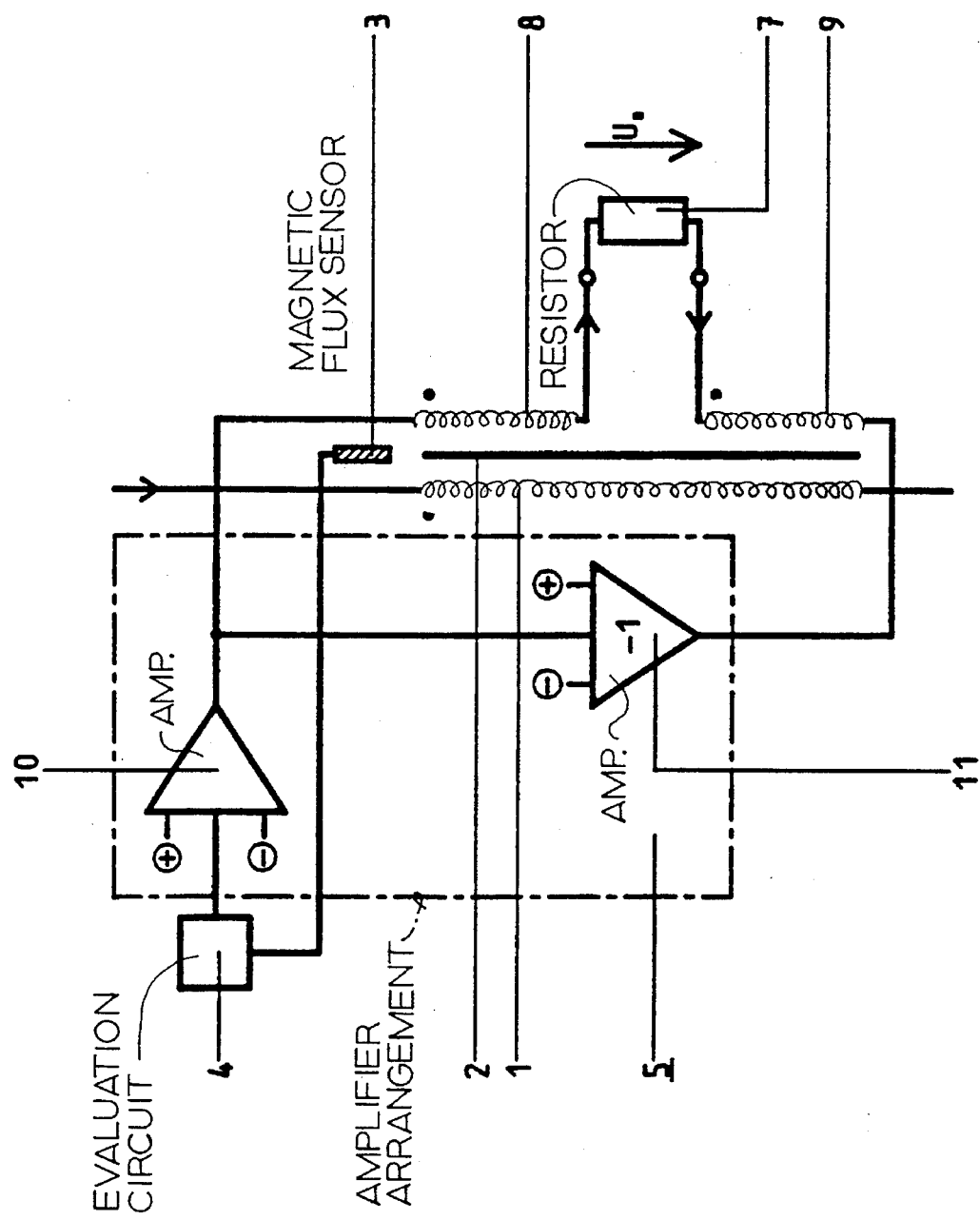
FIG. 2 is a circuit schematic for a current sensor constructed in accordance with the principles of the present invention having two sub-windings and an inverting amplifier.
Figure 3:
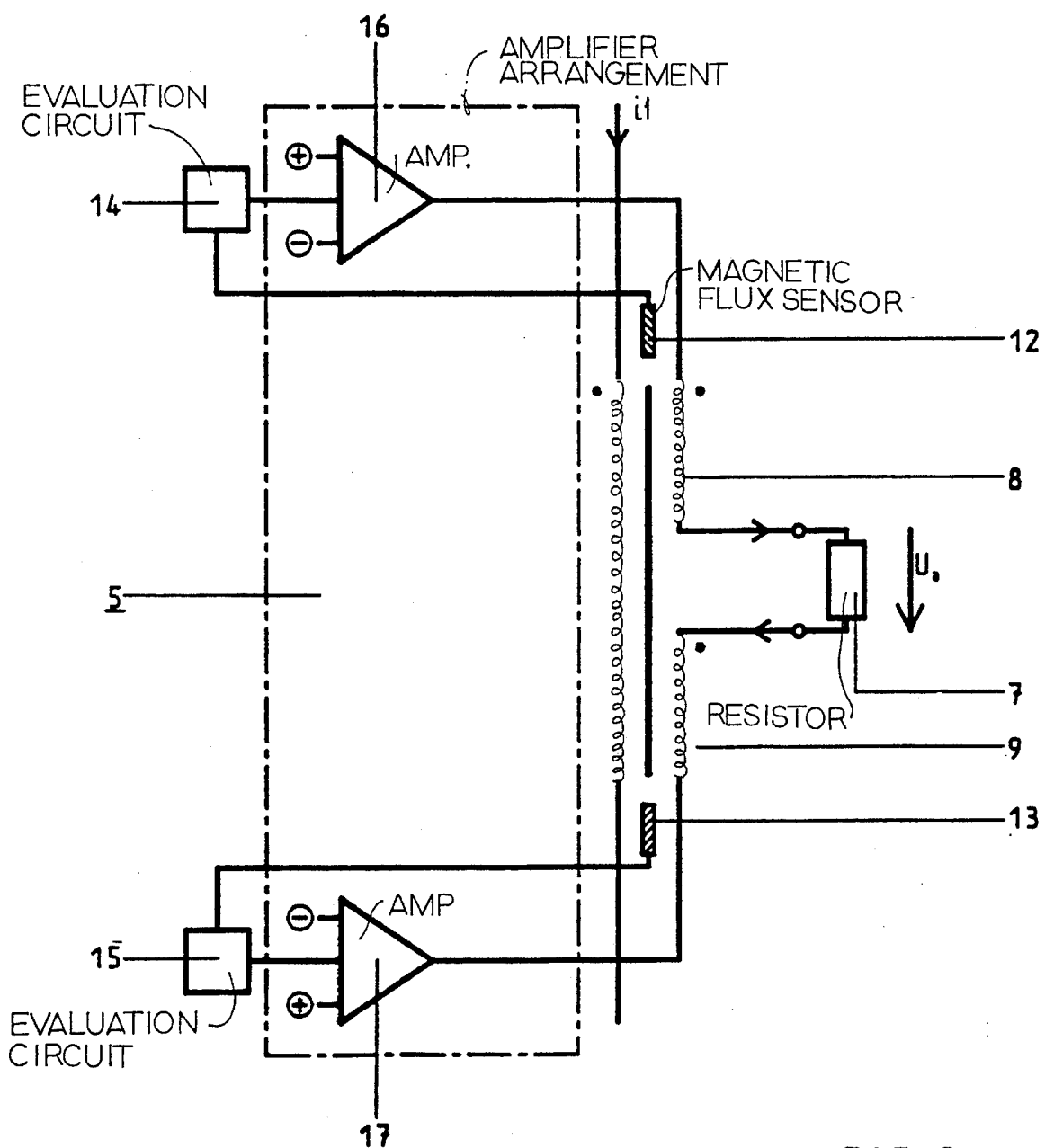
FIG. 3 is a circuit schematic for another embodiment of the current sensor of the invention wherein two sensors are provided for acquiring the magnetic flux in the magnetic core.
Figure 4:
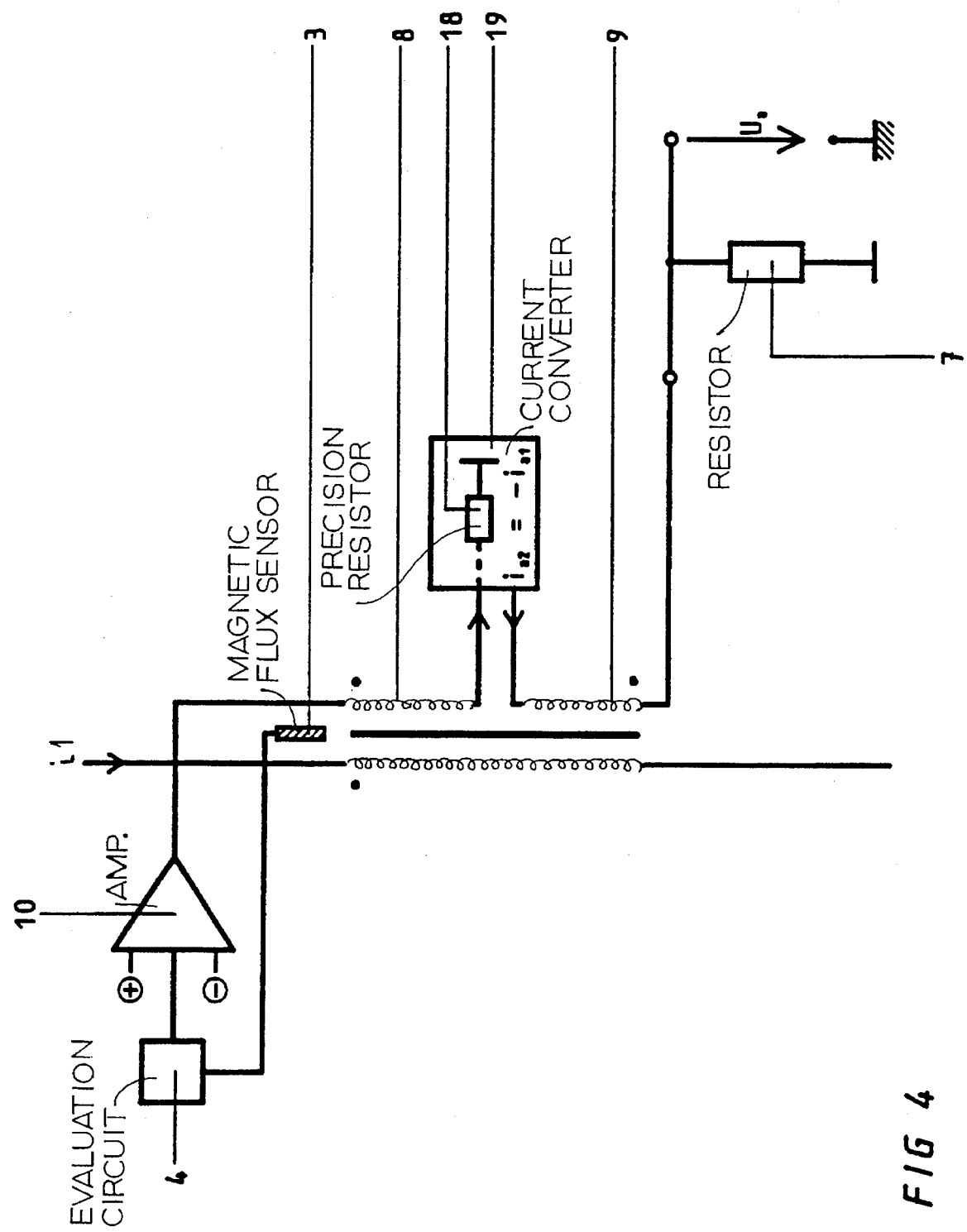
FIG. 4 is a circuit schematic for another embodiment of the current sensor of the invention wherein a reference of the output current to ground is also preserved.

Components in FIGS. 2–4 that are the same as in FIG. 1 are provided with the same reference numbers. In each of the embodiments of FIGS. 2–4 the current to be measured flows through the primary winding 1 of a current transformer, the magnetic flux of the magnetic core 2 is measured by a sensor 3 and is supplied to an amplifier arrangement 5 via an evaluation circuit 4.

The secondary winding, referenced 6 in FIG. 1, is divided into two sub-windings 8 and 9. One winding end of the sub-winding 8 is connected to the output of an amplifier 10 within the amplifier arrangement 5. The other winding end is connected via the terminating resistor 7 to a winding end of the second sub-winding 9. The other winding end of the sub-winding 9 is connected to the output of an inverting amplifier 11 in the amplifier arrangement 5, the input thereof being connected to the output of the amplifier 10. With a given direction of the current for the current i1 to be measured, for example, a current flows from the positive pole ⊕ of the supply voltage of the amplifier 10 via the sub-winding 10. Given this polarity of the output of the amplifier 10, the inverting amplifier 11 produces a connection from the negative pole e of the supply voltage to the output of the inverting amplifier 11. A current thus flows from the positive pole of the amplifier 10 via both sub-windings 8 and 9 as well as across the terminating resistor 7 to the negative pole e of the inverting amplifier 11. Given the same size of the supply voltage compared to the known circuit of FIG. 1, twice the voltage is thus available for generating the compensation current, so that either twice the maximum current can be measured or twice the output voltage $U_a$ is available given the same size of the terminating resistor 7.

When the direction of the current i1 to be measured reverses, a current flux will flow, accordingly, from the positive pole ⊕ of the supply voltage via the inverting amplifier 11, the sub-windings 8 and 9 and the terminating resistor 7 to the negative pole ⊖ of the supply voltage of the amplifier 10. By contrast to the known arrangement of FIG. 1, a symmetrical load of the supply voltage is thus established regardless of the direction of the current i1 to be measured.

The arrangement of FIG. 3 differs from the example of FIG. 2 in that two sensors 12 and 13 are provided instead of a single sensor 3, these driving respective amplifiers 16 and 17 within the amplifier arrangement 5 via a respective evaluation circuit 14 and 15. Again, the circuit can be implemented such that a symmetrical loading of the supply voltage is obtained, and thus twice as high a maximum current can be acquired, or the structural volume of the current sensor can be reduced.

FIG. 4 shows an arrangement that again has a single sensor 3 with an evaluation circuit 4 and a following amplifier 10 that feeds a sub-winding 8. In this embodiment, the sub-winding 8 is in series with a precision resistor 18 within a current converter 19. The voltage drop across the precision resistor 18 is utilized in the current converter 19 in order to acquire the size and direction of the compensation current. This voltage drop is thus suitable for feeding further sub-windings, for example the sub-winding 9, via one or more further amplifiers. Only one of these sub-windings need be connected to the terminating resistor 7 for the current sensor in order to generate an output voltage $U_a$ that is proportional to the current i1 to be measured. In this case, the output voltage $U_a$ is referred to ground.

In that case wherein the current sensor is part of a control circuit, it is also possible, of course, to employ the internal resistance of a following control unit instead of the terminating resistor 7 as the resistance across which the voltage drop is measured.

Although modifications and changes may be suggested by those skilled in the art, it is the intention of the inventor to embody within the patent warranted hereon all changes and modifications as reasonably and properly come within the scope of his contribution to the art.

I claim as my invention:

1. A current sensor comprising:

a current transformer having a primary winding, a magnetic core and a secondary winding comprised of two of series-connected sub-windings, a current to be measured flowing in said primary winding and generating a magnetic field in said magnetic core;

first and second amplifiers respectively connected to said sub-windings, said amplifiers each having an input and an output with said output of said first amplifier being connected to said input of said second amplifier, each of said two amplifiers having a positive pole and a negative pole and each amplifier being supplied with power at one of said poles dependent on a direction of said current to be measured;

sensor means for measuring deviations from a zero magnetic flux at said magnetic core and for supplying an output value corresponding to said deviations;

evaluation means for evaluating said output value and for supplying a control signal to the input of said first amplifier for causing said amplifiers to drive the respective sub-windings connected thereto for generating a respective compensation current in each sub-winding dependent on the current to be measured; and a resistor connected in series between said sub-windings, and said sub-windings across the respective outputs of said first and second amplifiers being connected, said resistor having a voltage thereacross proportional to said current to be measured.

2. A current sensor as claimed in claim 1 wherein, said second amplifier comprises an inverting amplifier.

3. A current sensor comprising:

a current transformer having a primary winding, a magnetic core and a secondary winding comprised of two of series-connected sub-windings, a current to be measured flowing in said primary winding and generating a magnetic field in said magnetic core;

first and second amplifiers respectively connected to said sub-windings, said amplifiers each having an input and an output with said output of said first amplifier being connected to said input of said second amplifier, each of said two amplifiers having a positive pole and a negative pole and each amplifier being supplied with power at one of said poles dependent on a direction of said current to be measured;

first and second sensor means for measuring deviations from a zero magnetic flux at respectively different positions at said magnetic core and for respectively supplying first and second output values corresponding to said deviations;

first and second evaluation means, respectively connected to said first and second sensor means, for respectively evaluating said first and second output values and for respectively supplying a control signal to the respective inputs of said first and second amplifiers for causing said first and second amplifiers to drive the respective sub-windings connected thereto for generating a respective compensation current in each sub-winding dependent on the current to be measured; and a resistor connected in series between said sub-windings, and said sub-windings across the respective outputs of said first and second amplifiers being connected, said resistor having a voltage thereacross proportional to said current to be measured.

* * * * *